(12) United States Patent
Chen et al.

(10) Patent No.: US 7,749,361 B2
(45) Date of Patent: Jul. 6, 2010

(54) MULTI-COMPONENT DOPING OF COPPER SEED LAYER

(75) Inventors: Jie Chen, Saratoga, CA (US); Peijun Ding, Saratoga, CA (US); Suraj Rengarajan, San Jose, CA (US); Ling Chen, Sunnyvale, CA (US); Tram Vo, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1069 days.

(21) Appl. No.: 11/445,690

(22) Filed: Jun. 2, 2006
(Under 37 CFR 1.47)

(65) Prior Publication Data
US 2007/0278089 A1 Dec. 6, 2007

(51) Int. Cl.
*C23C 14/34* (2006.01)
(52) U.S. Cl. .................. 204/192.17; 204/298.12; 438/687
(58) Field of Classification Search ........... 204/298.12, 204/192.12, 192.15, 192.17
See application file for complete search history.

(56) References Cited

U.S. PATENT DOCUMENTS

| | | | | |
|---|---|---|---|---|
| 5,541,007 | A | * | 7/1996 | Ueda et al. .............. 428/650 |
| 6,140,241 | A | | 10/2000 | Shue et al. .............. 438/692 |
| 6,387,805 | B2 | | 5/2002 | Ding et al. .............. 438/687 |
| 6,387,806 | B1 | | 5/2002 | Wang et al. .............. 438/687 |
| 6,426,293 | B1 | | 7/2002 | Wang et al. .............. 438/687 |
| 6,432,819 | B1 | | 8/2002 | Pavate et al. .............. 438/676 |
| 6,440,854 | B1 | | 8/2002 | Rozbicki .............. 438/687 |
| 6,444,567 | B1 | | 9/2002 | Besser et al. .............. 438/625 |
| 6,518,184 | B1 | | 2/2003 | Chambers et al. .............. 438/687 |
| 6,726,954 | B2 | | 4/2004 | Zhang et al. .............. 438/687 |
| 2004/0150113 | A1 | * | 8/2004 | Tonegawa .............. 257/758 |
| 2006/0088436 | A1 | * | 4/2006 | Okabe .............. 420/471 |
| 2006/0258152 | A1 | * | 11/2006 | Haider .............. 438/644 |

FOREIGN PATENT DOCUMENTS

EP 0 725 439 6/1993
JP 2004-169136 * 6/2004

OTHER PUBLICATIONS

Machine Translation of JP 2004-169136 dated Jun. 17, 2004.*
Murarka et al., "Copper Metallization for ULSI and Beyond", *Critical reviews in solid state and materials sciences*, vol. 20, 87-124 pp., 1995.

* cited by examiner

*Primary Examiner*—Rodney G McDonald
(74) *Attorney, Agent, or Firm*—Law Offices of Charles Guenzer

(57) ABSTRACT

A method of sputtering a copper seed layer and the target used therewith. The copper included in the sputtering target includes a first dopant reactive with copper and a second dopant unreactive with copper. Examples of the first dopant include Ti, Mg, and Al. Examples of the second dopant include Pd, Sn, In, Ir, and Ag. The amount of the first dopant may be determined by testing stress migration and that of the second dopant by testing electromigration.

12 Claims, 2 Drawing Sheets

MULTI-COMPONENT DOPING OF COPPER SEED LAYER

FIELD OF THE INVENTION

The invention relates generally to sputtering of materials. In particular, the invention relates to a copper seed layer in a via structure.

BACKGROUND ART

Copper is replacing aluminum as the favored metallization for forming advanced integrated circuits. The copper is used not only for the horizontal wiring patterns in multiple wiring levels but also for the vertical connections between wiring levels. An inter-level via structure is illustrated in the cross-sectional view of FIG. 1. A conductive feature 12, typically of copper, is formed in the surface of a lower level dielectric layer 14, typically of silica or other silicate glass although low-k dielectrics of differing compositions have been proposed. An upper level dielectric layer 16 is deposited over the lower-level dielectric layer 14 and its included conductive feature 12. The dielectric layer 16 typically has a thickness of about 1 μm, and it is not anticipated that the thickness can be reduced beyond about 0.7 μm because of dielectric breakdown and inter-level cross talk. A via hole 18 is etched through the upper level dielectric layer 16 to the underlying conductive feature 12. The figure is simplified and does not show etch stop layers and other features well known in the art but not directly pertinent to the invention.

A thin barrier layer 20 is deposited to form not only a blanket portion over the top of the dielectric layer 16 but also a sidewall portion 22 and a bottom portion 24 in the via hole 18. For copper metallization, the barrier layer 20 is typically composed of a bilayer of Ta/TaN, although other refractory metals and their nitrides are being considered. Sometimes, the bottom portion 24 of the barrier layer 20 is removed to reduce the via contact resistance. The barrier layer 20 performs a number of functions and is accordingly often referred to as a barrier/liner. It provides adhesion to the oxide dielectric layer 16 which does not bond well with copper. It acts as a barrier to prevent the copper from diffusing into the dielectric layer 16, which can short out the dielectric, and to prevent oxygen from diffusing from the oxide dielectric layer 16 into the copper metallization, which would degrade the copper conductivity. It also bonds to the after deposited copper.

A thin copper seed layer 26 is deposited over the barrier layer 20 and serves as a nucleation layer and a plating electrode for a thick ECP copper layer 28 deposited by electrochemical plating (ECP). Although the step is not illustrated, chemical mechanical polishing (CMP) removes the ECP copper layer 28 from the top surface leaving the ECP copper in the via hole 18. In an unillustrated dual damascene process, a vertically extending via hole at the bottom of the upper dielectric layer 16 is connected to a horizontally extending trench at the top of the upper dielectric layer 16. The barrier and copper seed layers 20, 26 are also coated onto the sides of the trench, and the ECP copper layer 28 is filled into both the via hole 18 and the trench, thereby simultaneously forming the vertical via and the horizontal wiring pattern. The conductive feature 12 may be part of a trench of the lower dielectric layer 14.

A somewhat similar structure may be used to form a contact to an underlying silicon circuit although additional contact layers are needed for the interface between the copper and the semiconducting silicon.

Sputtering, alternatively called physical vapor deposition (PVD), may be used to deposit both the barrier layer 22 and the copper seed layer 26. The nitride portion of the barrier layer 22 may be formed by reactive sputtering in which nitrogen gas is introduced into the sputter reactor which reacts with the sputtered refractory metal atoms to deposit a refractory metal nitride on the wafer. However, as the minimum feature width of advanced integrated circuits is being pushed to 0.13 μm and even lower, the aspect ratio of the via hole, that is, the ratio of its depth to its width, has increased to 5 and higher, a difficult geometry for sputtering. To obtain good sidewall and bottom coverage in the via hole 18 requires some advanced sputtering techniques including DC biasing of the wafer and production of a large ionization fraction of the sputtered metal atoms so that the accelerated metal ions are attracted deep within the via hole 18. Fu et al. describe a sputter reactor usable for this purpose in U.S. Pat. No. 6,290,825, incorporated herein by reference in its entirety. In a process called self-ionized plasma (SIP) sputtering, a small unbalanced magnetron is composed of a strong outer pole surrounding an inner pole of lesser magnetic intensity. Because it is small, it is rotated about the back of the target to provide uniform sputtering. A large amount of power is applied to the target and the small magnetron increases the effective power density near the magnetron to thereby increase the plasma density to such an extent that a substantial fraction of the sputtered atoms are ionized. The negatively biased wafer accelerates the positively charged metal ions deep within the high aspect-ratio holes.

It is also possible to deposit the copper seed layer 26 by chemical vapor deposition (CVD), which is better adapted for coating a conformal layer even into high aspect-ratio holes, but sputtering is preferred for economic reasons. The barrier layer 22 or some of its sub-layers may also be deposited by CVD.

Especially for very narrow via holes, the barrier layer 20 should be made as thin as possible. Excess width of the barrier sidewall portion 22 decreases the cross section of the copper conductive filling the remainder of the via hole 18, thus increasing the via resistance. If the barrier bottom portion 24 is not removed, an excessively thick bottom portion 24 also increases the via resistance since the barrier materials are not good conductors. However, the barrier thickness needs to be large enough to guarantee the barrier layer 22 is not formed with pin holes or localized areas that are so thin that they do not serve as an adequate barrier.

Atomic layer deposition (ALD) is a CVD technique that has been developed to deposit very thin metal nitride layers. In ALD, the composition of the feed gas is alternated to permit the deposition of a monolayer of the metal followed by a monolayer of nitrogen. Thereby, the barrier material is deposited one atomic layer at a time, and a few atomic layers have been observed to be sufficient to form an adequate barrier layer. However, ALD tantalum nitride has been observed to have properties differing significantly from PVD tantalum nitride. The ALD form has a higher electrical resistivity and bonds much more poorly with the copper. Furthermore, ALD is not readily usable to form a metallic tantalum layer, which has the advantage of bonding fairly well with the silicate dielectric.

Ding et al. in U.S. Pat. No. 6,387,805 have suggested dispensing with the nitride barrier layer and instead doping the copper seed layer with magnesium, aluminum, or one of a few other metals which form stable oxides at the interface with the silicate dielectric, thereby acting as a barrier layer. It is not clear, however, that the suggested dopants provide adequate bonding to the dielectric.

Several others have suggested doping the copper seed layer with at least one dopant. Their reasons range from preventing agglomeration, reducing electromigration, adhesion, and general surface properties.

We believe that these suggestions in the prior art are insufficient in determining a reasonable dopant contribution in copper seed layers grown in a commercial environment.

SUMMARY OF THE INVENTION

A method of sputtering a copper seed layer and the resulting product in which the seed layer is alloyed with one or more dopants from each of two classes. The first class of dopants is reactive with copper. Preferred examples of the first class of dopants are titanium, magnesium, and aluminum. The second class of dopants is non-reactive with copper. Preferred examples of the second class of dopants are palladium, tin, indium iridium and silver. Of these tin is the most economical.

More than one dopant may be included from one or both of the classes.

The amount of reactive doping required may be determined by stress migration testing and the amount of non-reactive doping may be determined by electro migration testing. Generally, the doping level for either class of dopant is in the range of 0.1 to 20 wt %.

The invention also includes a copper sputtering target having a sputtering surface composed of a copper alloy including dopants from both the first and second classes and usable in a sputter reactor. More than one dopant may be included from each class.

DESCRIPTION OF THE PREFERRED EMBODIMENTS

Figure 1:
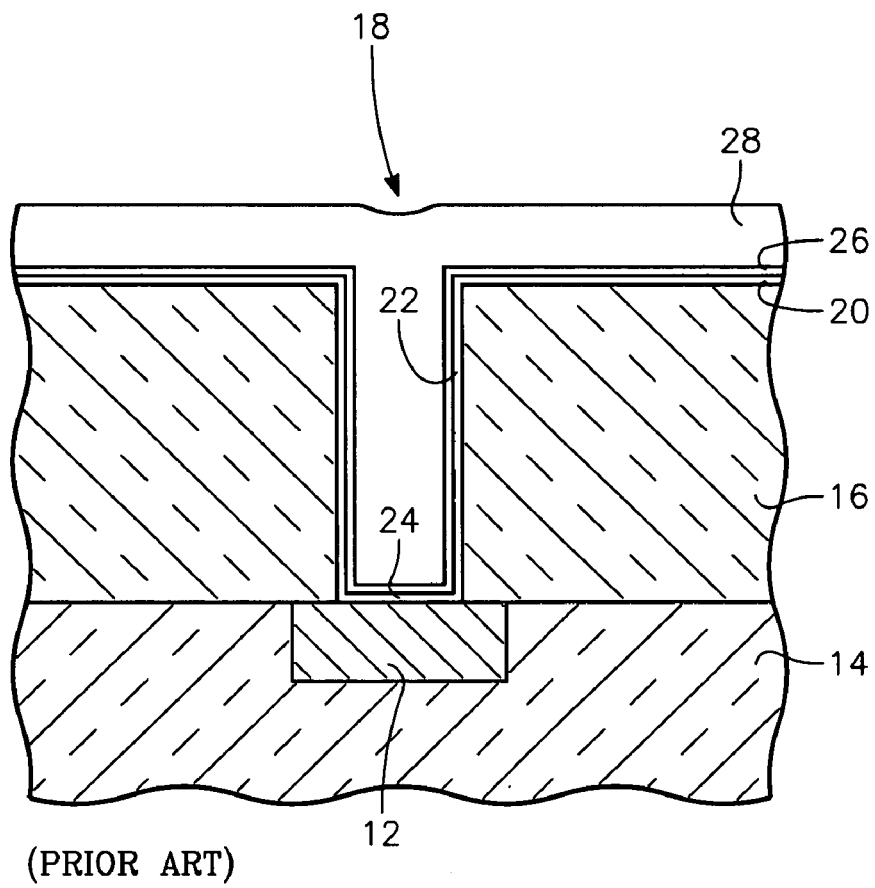
FIG. 1 is a cross-sectional view of a conventional via metallization part way through its formation.

We believe that dopants for copper seed layer can be divided into two main classes, reactive and non-reactive, producing different effects.

Reactive dopants react with the copper and other metals to form a stable compound alloy similar to an intermetallic alloy. The surface of a such a copper alloy bonds well with the underlying barrier layers formed of other refractory metals such as tantalum, titanium, tungsten and their nitrides. That is, the copper alloy layer adheres well to the barrier layer.

Horizontal electrical interconnections are formed in a multi-layer structure. In typical copper metallization, the copper line is deposited over a tantalum-based barrier layer, most usually a Ta/TaN bilayer with the metallic tantalum contacting the copper and the nitride contacting the oxide. The barrier layer in turn is deposited over an oxide dielectric layer, usually based on silicon oxide, perhaps including dopants such as fluorine. During fabrication and operation, the multi-layer structure is subjected to temperature cycling, and stress develops between the layers. Such stress is often relieved by the relatively mobile copper migrating horizontally to regions of lower stress in a process often called stress migration. However, such migration tends to thin out portions of the copper line relative to the thicker portions of the line, thus increasing the local resistivity of the thinned portion of the line. As electrical current is passed through the line, the increased resistivity results in an increased temperature of the thinned portion relative to the thicker portions, thereby further increasing the stress and promoting further stress migration. If the process continues, portions of the line may delaminate from the barrier layer because of excessive stress.

However, the increased adhesion provided by the reactive dopants lessens the stress migration since the copper is more firmly bonded to the barrier layer and further decreases the probability of delamination even in the presence of high stress.

Reactive dopants may be characterized as metals having a low electro negativity with respect to copper such that there a chemical reaction with the copper is more easily activated. The most useful reactive dopants are titanium, magnesium, and aluminum.

On the other hand, non-reactive dopants do not bond strongly with copper and instead tend to diffuse through the copper. However, copper as well as aluminum is almost always formed of small crystallites (grains) with grain boundaries between them. The non-reactive dopants tend to diffuse to the surface of the crystallites and form a non-reactive surface layer of the dopant species between the crystallites.

Electromigration is a well known effect in metal interconnects in which metal atoms tend to migrate along the conduction path of the current carried by the metal line. The electromigration is promoted by elevated temperatures. As a result, any inhomogeneous thinning in a metal line causes a localized region of higher temperature relative to the thicker or defect-free portions of the line. As a result, the metal tends to migrate away from the thinned area to thicker areas. The electromigration thereby increases the resistivity in the thinned portion and the temperature there rises further such that electromigration is further increased. Eventually, the thinned portion is reduced to nothing and the line ruptures at that point.

It is believed that electromigration of metal atoms occurs primarily along the grain boundaries since the metal is only loosely bound at the grain surface and voids may exist within the boundaries.

One of the advantages of copper over aluminum for metallization is its reduced electromigration. Nonetheless, copper electromigration continues to be an issue as the line thickness decreases and the current density increases for advanced interconnects.

It is believed that the non-reactive surface layer passivates the grain surfaces and impedes electromigration along the grain boundaries.

The non-reactive dopants useful with copper seed doping may be characterized as metals having a high electro negativity though not necessarily greater than that of copper. They may also be characterized as being noble or nearly noble. The most useful non-reactive dopants are palladium, tin, indium, iridium, and silver. These metals are clearly less reactive than the reactive metals mentioned above.

The doping concentrations in copper for either the reactive or non-reactive dopants copper may be in the range of 0.1 to 20 wt %. The target otherwise is principally composed of copper, that is, the copper fraction is at least 80 wt %. Beneficial results have been obtained with doping levels below 10 wt % and even below 5 wt %. However, two factors should be observed in selecting the doping levels. First, the doping concentration must be kept low enough that it does not exceed the solid solubility limit above which the dopant precipitates rather than forms an alloy. Secondly, any dopants increase the resistivity relative to pure copper. As a result, excessive doping levels should be avoided to minimize interconnect resistance. That is, only the minimum doping concentrations should be used to achieve the desired result, whether it be reducing stress migration or electromigration to acceptable predetermined levels. However, a substantial fraction of the seed dopants may diffuse into the ECP during the anneal after ECP to improve the electromigration and stress migration of the ECP layer. Accordingly, a high doping concentration in the seed layer may result in a substantially reduced doping concentration in the ECP layer and hence relatively little effect on the overall interconnect resistance.

Despite its high cost, palladium is favored for the non-reactive dopant because of its small increase in resistivity when alloyed with copper. The cost of the noble dopant metal further motivates the minimization of their doping levels.

The separation of dopants into those reducing stress migration and those reducing electromigration allows the two doping concentrations to be separately determined. Stress migration failure levels may be determined by subjecting the circuit to repeated thermal cycles, for example, between −50 and 300° C., with no or low levels of current being applied to the interconnect lines. On the other hand, electromigration failure levels may be determined by subjecting the interconnect lines of a circuit to a long period of high current, typically somewhat in excess of that intended in operation. At the end of the separate migration test period, a large number of interconnects are tested for integrity or excessive resistance.

Figure 2:
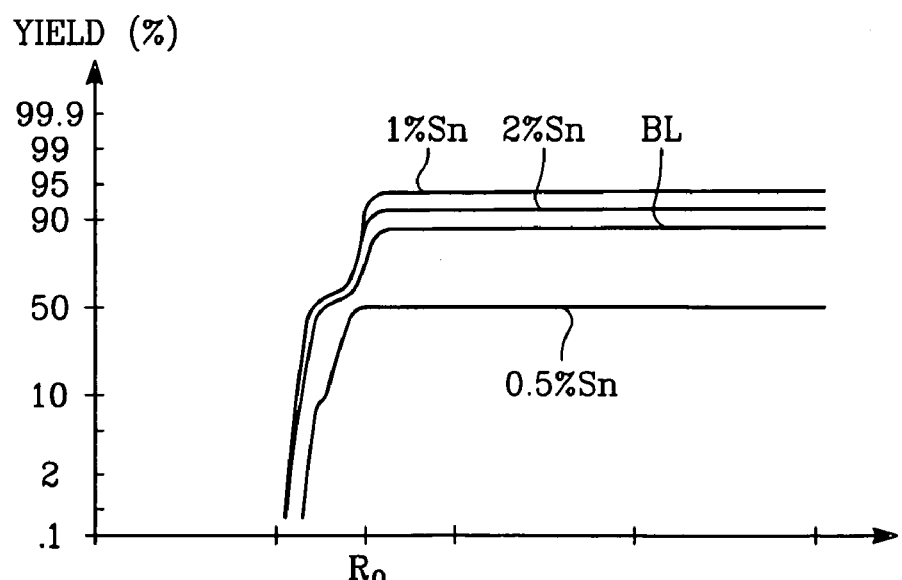
FIG. 2 is a chart plotting yield as a function of maximum allowed via resistance for three time doping levels in copper.

In FIG. 2 are illustrated data generated in determining the optimum doping density, presumably for electromigration effects. The horizontal axis plots resistance for a 900,000 chain of vias while the vertical axis plots the percentage yield of such chains having no more than that resistance, that is, a maximum resistance of the plotted value. Maximum yield and minimum resistance are desired. A baseline curve BL plots the yield for a baseline process with no significant doping of the seed copper. The other curves plot the yield for three percentages of tin doping, specifically 0.5% Sn, 1% Sn, and 2% Sn, all values given in wt %. The baseline process has a knee at about 80% yield with a resistance of $R_0$. Thus, if a maximum resistance of $R_0$ is specified, the yield is about 80%. A somewhat higher specification of resistance does not significantly increase the yield, but a lower specification significantly reduces the yield. Doping of 0.5% Sn slightly reduces the resistance at the knee but the yield is poorer than for no doping. On the other hand, doping of 1% Sn increases the yield to above 90% with a minimal increase in resistance. However, a further increase in doping to 2% Sn returns the yield curve closer to the baseline curve BL. Similar data have been generated for aluminum doping of 1% and 2%. These data show a monotonic increase in yield though less than for 1% Sn doping.

Figure 3:
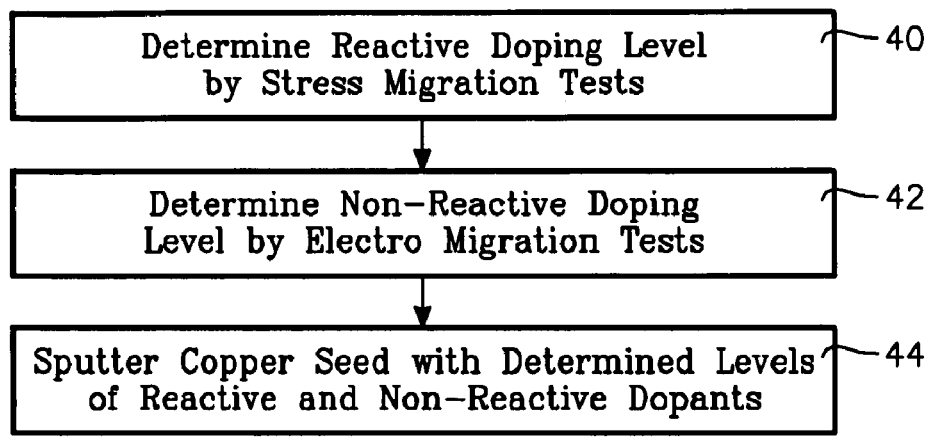
FIG. 3 is a flow chart of one method of practicing the invention.

The overall process is illustrated in the flow diagram of FIG. 3. In step 40, the doping concentration for the reactive doping species is determined and preferably minimized by tests emphasizing the effects of stress migration. In a separate step 42, the doping concentration for the non-reactive doping species is determined and preferably minimized by tests emphasizing the effects of electromigration. A sputtering target is prepared of a copper alloy including the so determined concentrations of reactive and non-reactive dopants. In step 44, integrated circuits are formed using the copper alloy sputter target.

The effects of non-reactive dopants can be determined by using x-ray crystallography or other technique to determine the average grain size of copper crystallites. Generally, the smaller the grain size the better. The grain size of the copper seed layer will affect the grain size of the ECP copper plated on it, thus after its metallurgical behavior and device reliability.

Figure 4:
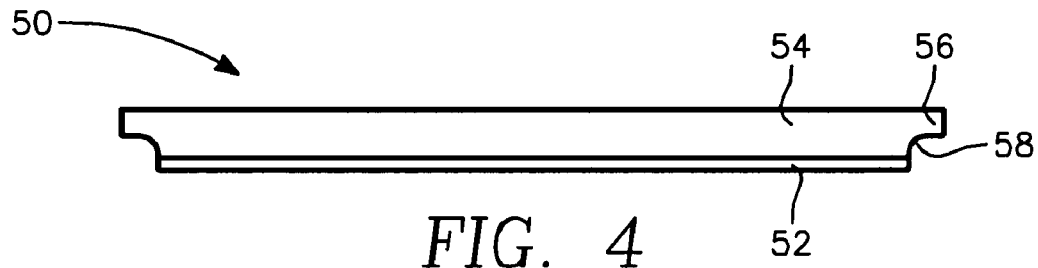
FIG. 4 is a cross-sectional view of a sputtering target of a copper alloy including multiple dopants.

A sputtering target 50, illustrated in the cross-sectional view of FIG. 4, includes at least a surface sputtering layer 52 composed of a copper alloy including both reactive and non-reactive dopants. Although integral copper targets of a uniform copper alloy composition are commonly used, in view of the possibly expensive non-reactive dopants, it may be advantages to bond the surface sputtering layer 52 to a backing plate 54, which may be composed of a different copper composition. In particular, it may be essentially pure copper or may lack any non-reactive dopant. The backing plate 54 may be shaped to have an annular flange 56 for mounting the target 50 on an isolator supported on the sputtering chamber and a shaped sidewall 58 to cooperate with a closely spaced shield to create a plasma dark space between the sidewall 58 and shield and prevent sputtering of the backing plate and copper deposition on the isolator.

Figure 5:
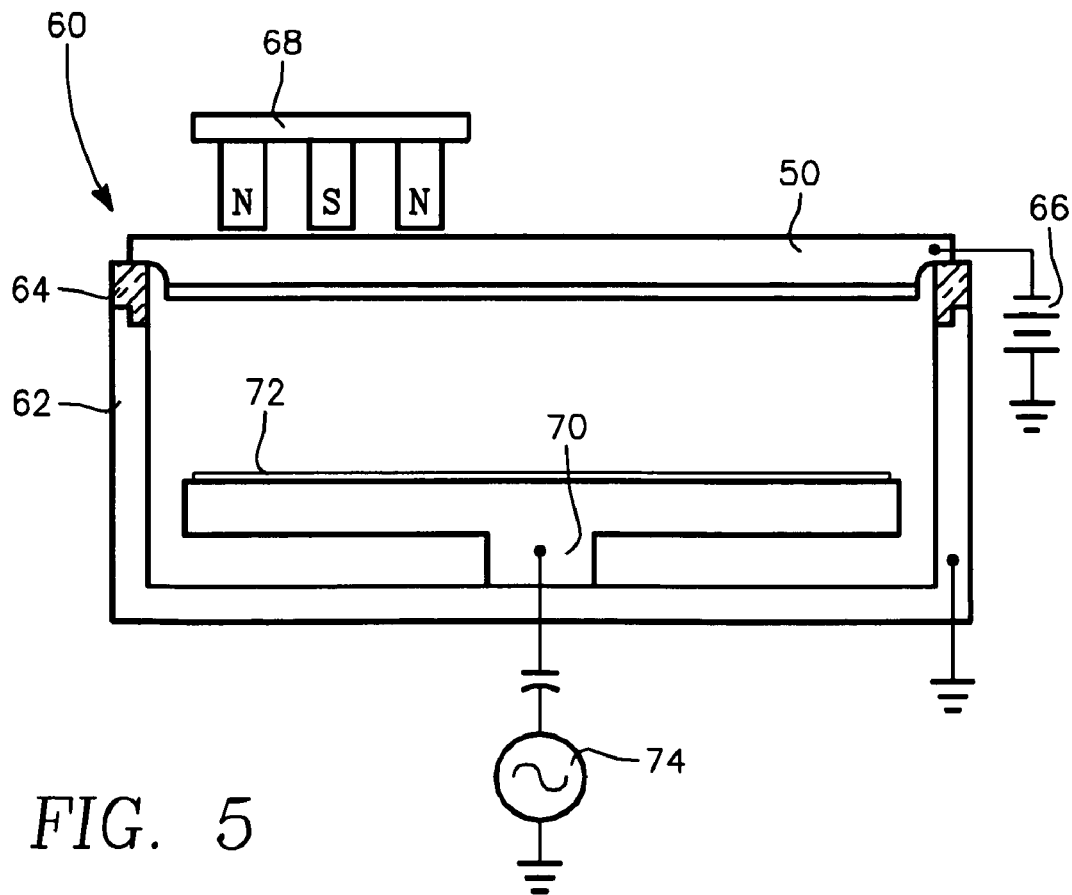
FIG. 5 is a cross-sectional view of a sputter chamber mounting the sputtering target of FIG. 4.

A copper sputter chamber 60, illustrated in the cross-sectional view of FIG. 5, includes a grounded vacuum chamber 62 mounting the target 50 through an annular electrical isolator 64. A DC power supply 66 negatively biases the target 50 with respect to the grounded chamber or chamber shields to discharge an argon working gas admitted into the chamber 62 into a plasma which sputters the copper target 50. A magnetron 68 having a closed outer pole of one magnetic polarity surrounding an inner pole of the opposed magnetic polarity is rotated about the chamber's central axis to increase the plasma density. A pedestal 70 supports in opposition to the target 50 a wafer 72 containing the structure of FIG. 1. Typically, an RF power supply 74 is capacitively coupled to the pedestal to create a negative self-bias to attract ionized sputter ions deep within the via hole in which the seed layer is being coated.

Although the invention was developed for a copper seed layer underlying an ECP copper fill, many proposals have been made to use copper sputtering to completely fill the via hole. In this case, the problems of electro migration and stress migration can still occur. Accordingly, the advantages of the invention can be applied to a copper sputter fill process.

The invention thus allows separate doping optimizations for different effects in advanced copper interconnects. The principal change needed over the conventional copper seed sputtering is a change of the target composition.

The invention claimed is:

1. A sputtering target comprising a sputtering layer comprising a copper alloy principally comprising copper and additionally comprising:
    a first dopant chosen from the group consisting of titanium, magnesium, and aluminum and having a concentration in the copper alloy determined by testing emphasizing stress migration; and
    a second dopant chosen from the group consisting of palladium, tin, indium, iridium, and silver and having a concentration in the copper alloy determined by testing emphasizing electro migration.

2. The target of claim 1, wherein the second dopant comprises palladium.

3. The target of claim 1, wherein the concentrations of the first and second dopants in the copper alloy are within a range of 0.1 to 5 wt % and the concentration of the copper in the copper alloy is at least 90 wt %.

4. A copper sputter reactor, including a chamber enclosing a substrate support and mounted with a sputtering target in opposition to the support, wherein the target includes a sputtering layer comprising a copper alloy principally comprising copper and additionally comprising:
- a first dopant chosen from the group consisting of titanium, magnesium, and aluminum and having a concentration in the copper alloy determined by testing emphasizing stress migration; and
- a second dopant chosen from the group consisting of palladium, tin, indium, iridium, and silver and having a concentration in the copper alloy determined by testing emphasizing electromigration.

5. The reactor of claim 4, wherein the second dopant comprises palladium.

6. A method of depositing a copper layer into a hole formed in a dielectric layer of a substrate, comprising:
- a first step of determining by testing emphasizing stress migration a first concentration in a first copper alloy of a first dopant selected from the group consisting of titanium, magnesium, and aluminum;
- a second step of determining by testing emphasizing electromigration a second concentration in a second copper alloy of a second dopant selected from the group consisting of palladium, tin, indium, iridium, and silver; and
- sputtering onto the substrate from a target including a sputtering layer comprising a third copper alloy principally comprising copper and additionally comprising the first concentration of the first dopant and the second concentration of the second dopant.

7. The method of claim 6, wherein the second dopant comprises palladium.

8. The target of claim 1, wherein the testing for determining the concentration of the first dopant includes only repeated thermal cycling of interconnect lines of the copper alloy and the testing for determining the concentration of the second dopant includes only subjecting the interconnect lines to extended periods of current of a predetermined level.

9. The reactor of claim 4 wherein the testing for determining the concentration of the first dopant includes only repeated thermal cycling of interconnect lines of the copper alloy and the testing for determining the concentration of the second dopant includes only subjecting the interconnect lines to extended periods of current of a predetermined level.

10. The method of claim 6, wherein the first step includes only repeated thermal cycling of interconnect lines of the copper alloy and the second step includes only subjecting the interconnect lines to extended periods of current of a predetermined level.

11. A method of depositing a copper layer into a hole formed in a dielectric layer of a substrate, comprising:
- a first testing step including measuring stress migration in a first interconnect comprising a seed layer of a first copper alloy comprising copper and a first dopant chosen from the group consisting of titanium, magnesium, and aluminum and to thereby determine a first concentration of the first dopant in a manufacturing copper alloy principally comprising copper and additionally comprising the first concentration of the first dopant;
- a second testing step including measuring electromigration in a second interconnect comprising a seed layer of a second copper alloy comprising copper and a second dopant chosen from the group consisting of palladium, tin, indium, iridium, and silver to thereby determine a second concentration of the second dopant in the manufacturing copper alloy additionally comprising the second concentration of the second dopant; and
- sputtering onto the substrate a copper seed layer from a target including a sputtering layer comprising the manufacturing copper alloy.

12. The method of claim 11,
- wherein the first testing step is performed after repeated thermal cycling of the first interconnect, and
- wherein the second testing step is performed after subjecting the second interconnect to extended periods of current of a predetermined level.

* * * * *